(12) United States Patent
Rebergen

(10) Patent No.: US 8,410,672 B2
(45) Date of Patent: Apr. 2, 2013

(54) THERMALLY CONDUCTIVE MOUNTING ELEMENT FOR ATTACHMENT OF PRINTED CIRCUIT BOARD TO HEAT SINK

(75) Inventor: Johannes Alexander Rebergen, Eindhoven (NL)

(73) Assignee: Koinklijke Philips Electronics N.V., Eindhoven (NL)

( * ) Notice: Subject to any disclaimer, the term of this patent is extended or adjusted under 35 U.S.C. 154(b) by 39 days.

(21) Appl. No.: 12/936,547

(22) PCT Filed: Apr. 10, 2009

(86) PCT No.: PCT/IB2009/051521
§ 371 (c)(1),
(2), (4) Date: Oct. 6, 2010

(87) PCT Pub. No.: WO2009/128005
PCT Pub. Date: Oct. 22, 2009

(65) Prior Publication Data
US 2011/0031864 A1 Feb. 10, 2011

(30) Foreign Application Priority Data
Apr. 17, 2008 (EP) .................................... 08154716

(51) Int. Cl.
*H01J 1/02* (2006.01)
(52) U.S. Cl. ......................................... 313/46; 313/113
(58) Field of Classification Search ................... 313/46, 313/113; 29/830, 839
See application file for complete search history.

(56) References Cited

U.S. PATENT DOCUMENTS

| | | |
|---|---|---|
| 5,032,898 A | 7/1991 | Bowen et al. |
| 5,079,567 A | 1/1992 | Beaman et al. |
| 5,373,099 A | 12/1994 | Boitard et al. |
| 5,521,439 A | 5/1996 | Casati et al. |
| 6,582,100 B1 | 6/2003 | Hochstein et al. |
| 7,230,831 B2 | 6/2007 | Luckner et al. |
| 2002/0113244 A1 | 8/2002 | Barnett et al. |
| 2003/0063441 A1 | 4/2003 | Yamazaki et al. |
| 2005/0259401 A1 | 11/2005 | Han et al. |

(Continued)

FOREIGN PATENT DOCUMENTS

| | | |
|---|---|---|
| EP | 0295387 A2 | 12/1988 |
| JP | 07326692 A | 12/1995 |
| WO | 2006074169 A2 | 7/2006 |
| WO | 2007058438 A1 | 5/2007 |
| WO | 2007129231 A1 | 11/2007 |

*Primary Examiner* — Anne Hines
(74) *Attorney, Agent, or Firm* — David Zivan; Mark Beloborodov

(57) ABSTRACT

An arrangement for heat dissipation for a heat generating electrical component (10) comprising a heat generating electrical component (10) arranged on the printed circuit board (20), in thermal contact with a thermally conductive layer (23) of the PCB. A thermally conductive mounting element (40) is attached to the thermally conductive layer (23) by means of soldering, and has a connecting portion (43) adapted to engage with a recess (31) in the heat sink (30); thereby enabling attachment of the printed circuit board (20) to the heat sink (30); wherein a thermal path is provided, from the heat generating electrical component (10), via the thermally conductive layer (23) and the mounting element (40), to the heat sink (30). By utilizing a thermally conductive mounting element, heat dissipation can be achieved with a PCB provided with a single thermally conductive layer, rather than the multi layer PCB required in prior art arrangements. As no screws and/or adhesives are used to attached the PCB to the heat sink, the PCB may easily be removed, and the problem of bending caused by differences in coefficient of thermal expansion is overcome.

9 Claims, 4 Drawing Sheets

U.S. PATENT DOCUMENTS

| | | |
|---|---|---|
| 2006/0098441 A1 | 5/2006 | Chou |
| 2007/0025103 A1 | 2/2007 | Chan |
| 2007/0235739 A1 | 10/2007 | Sun et al. |
| 2008/0296599 A1 * | 12/2008 | Mazzochette .................. 257/98 |

* cited by examiner (Prior art) Fig. 1

THERMALLY CONDUCTIVE MOUNTING ELEMENT FOR ATTACHMENT OF PRINTED CIRCUIT BOARD TO HEAT SINK

TECHNICAL FIELD

The present invention relates to an arrangement for heat dissipation for a heat generating electrical component comprising: a heat sink; a printed circuit board arrangeable on the heat sink, the printed circuit board comprising a dielectric substrate provided with a thermally conductive layer on a side facing away from the heat sink; a heat generating electrical component arranged on the printed circuit board, the heat generating electrical component being in thermal contact with the thermally conductive layer.

BACKGROUND OF THE INVENTION

When arranging a heat generating electrical component on a circuit board, it may be desireable to dissipate the generated heat using some type of heat sink. One example of heat generating components is light emitting diodes (LEDs).

Light emitting diodes (LEDs) are attractive for a wide range of lighting applications for reasons such as efficiency and long life time compared to conventional lighting such as incandescent and fluorescent bulbs. Nevertheless, in many applications, the heat developed by the LED causes reduced efficiency and influences long-term reliability of LED devices. Consequently, thermal management of LEDs is crucial for proper operation and extended life time.

An LED is typically encapsulated in transparent resin which is poor thermal conductor. Thus, most of the heat produced is conducted through the backside of the LED chip. Therefore, to maintain low junction temperature and keep good performance of the LED, LED devices are typically provided with a heat sink. FIG. 1 illustrates a typical prior art arrangement, where an LED 1 is mounted to a printed circuit board (PCB) 2. The PCB 2 comprises copper sheets 3, 4 laminated onto either side of a dielectric substrate 8. Typically, there are electrical circuit traces etched from the upper copper sheet 3 (i.e. the copper sheet facing the LED) to provide appropriate circuitry. The copper sheets 3, 4 arranged on either side of the PCB 2 also serves as thermally conductive layers 3, 4. These thermally conductive layers 3, 4 are linked by a series of thermal vias 5. The LED 1 is soldered to the PCB 2, wherein PN junction of the LED 1 is electrically connected to the electrical circuit traces of the PCB. The soldering also provides thermal contact between the PN junction and the upper thermally conductive layer 3 of the upper copper sheet 3. The printed circuit board 2 is typically mounted to a heat sink 6 using screws 7. The arrangement may also be provided with a thermal paste to improve thermal contact between the heat sink 6 and the thermally conductive layer 4 facing the heat sink. Through this arrangement, heat generated at the LED junction is conducted through the thermally conductive layers 3, 4 of the printed circuit board 2 and to the heat sink 6 and then to the ambient environment.

However, the multi layer PCB described above may be to expensive to be utilized in low cost applications. Furthermore, as the PCB is attached with screws to the heat sink, differences in coefficient of thermal expansion (CTE) between the PCB and the heat sink may result in stress, causing the printed circuit board to bend and the LED to tilt.

SUMMARY OF THE INVENTION

In view of the above, an object of the invention is to solve or at least reduce the problems discussed above. In particular, an object is to provide a cost efficient arrangement enabling efficient heat dissipation.

According to an aspect of the invention, there is provided an arrangement for heat dissipation for a heat generating electrical component comprising: a heat sink; a printed circuit board arrangeable on the heat sink, the printed circuit board comprising a dielectric substrate provided with a thermally conductive layer on a side facing away from the heat sink; a heat generating electrical component arranged on the printed circuit board, the heat generating electrical component being in thermal contact with the thermally conductive layer, wherein a thermally conductive mounting element is attached to the thermally conductive layer by means of soldering, the mounting element having a connecting portion adapted to engage with a recess in the heat sink; thereby enabling attachment of the printed circuit board to the heat sink; wherein a thermal path is provided, from the heat generating electrical component, via the thermally conductive layer and the mounting element, to the heat sink.

By utilizing a thermally conductive mounting element, heat dissipation can be achieved with a PCB provided with a single thermally conductive layer, rather than the multi layer PCB (having thermally conductive layers on both sides linked with thermal vias) required in prior art arrangements. The single layer PCB is typically associated with lower costs than a multilayer PCB. Furthermore, no thermal paste is needed between the PCB and the heat sink. As no screws and/or adhesives are used to attached the PCB to the heat sink, the PCB may easily be removed, for example, in the event of a malfunctioning LED. Furthermore, the problem of bending of the PCB caused by differences in coefficient of thermal expansion is overcome. Utilizing a single layer PCB may also be advantageous as it can be thinner than a multi layer PCB (typically about 0.4 mm, instead of 1.6 mm).

The present invention is based on the understanding that by using a thermally conductive mounting element, and properly designed interfaces between the mounting element and the thermally conductive layer, and between the mounting element and the heat sink, sufficient heat dissipation may be achieved from the heat generating electrical component to the heat sink by a single layer PCB.

The recess may be a groove debouching at a periphery of the heat sink, wherein an opening is formed in the heat sink allowing the mounting element to be slid out of the groove. By this arrangement the PCB may be removed (or attached) from the heat sink by moving the PCB parallel to the groove. Furthermore, the design is feasible for production as it may be extruded, which is cost efficient. The design also typically enables a large contact surface between the mounting element and the heat sink, due to the longitudinal extension of the groove, and thereby efficient heat dissipation.

The connecting portion may be adapted to be brought into contact with two opposing sides of the inside of the recess, whereby the contact surface between the mounting element and the heat sink can be maximized enabling efficient heat dissipation.

The connecting portion may be adapted to be compressed upon engagement, whereby the connecting portion can engage the recess through spring action. Thus, the PCB can be attached to the heat sink by placing the PCB over the heat sink and simply pressing the mounting element into the groove. This may also promote frictional engagement of the connecting portion to the recess.

The recess may have a neck, enabling the recess to hold the connecting portion in place, for example, by improved frictional engagement between the connecting portion and the recess.

The recess may have an abutment adapted to engage with a corresponding abutment of the connecting portion, thereby enabling reliable attachment of the connecting portion to the recess.

The printed circuit board may be provided with an opening, wherein the mounting element extends through the opening. This enables reliable attachment of a PCB to the heat sink using a single mounting element.

According to an embodiment, the mounting element is made of copper which has good thermal conductivity and enables efficient heat dissipation. However, the mounting element could also be made of some other material having a high thermal conductivity such as, for example, carbon or an aluminum alloy.

Other objectives, features and advantages will appear from the following detailed disclosure, from the attached dependent claims as well as from the drawings.

BRIEF DESCRIPTION OF THE DRAWINGS

The above, as well as additional objects, features and advantages of the present invention, will be better understood through the following illustrative and non-limiting detailed description of preferred embodiments of the present invention, with reference to the appended drawings, where the same reference numerals will be used for similar elements, wherein.

DETAILED DESCRIPTION OF PREFERRED EMBODIMENTS

Figure 1:
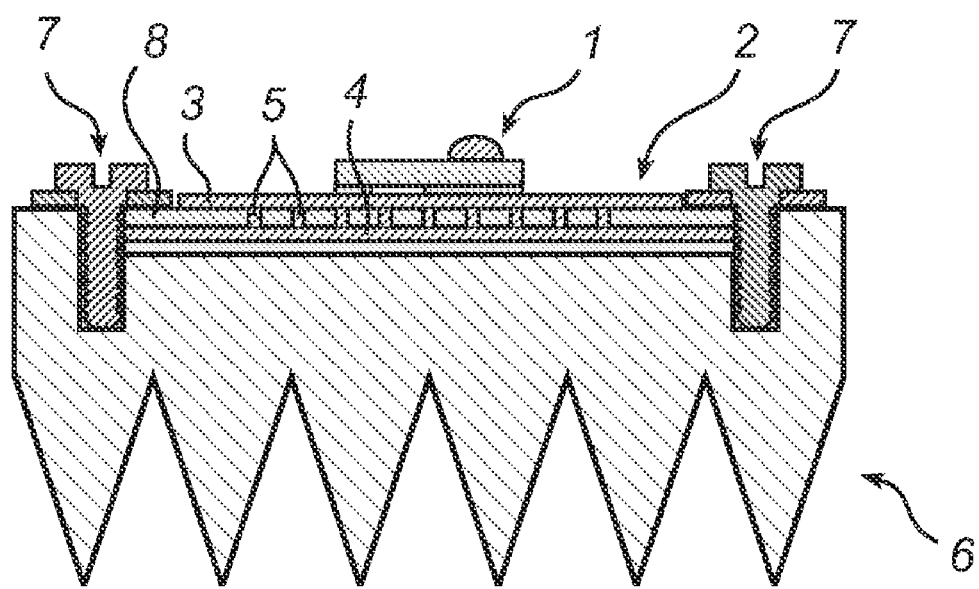
FIG. 1 is a cross sectional view of a prior art arrangement.
Figure 2:
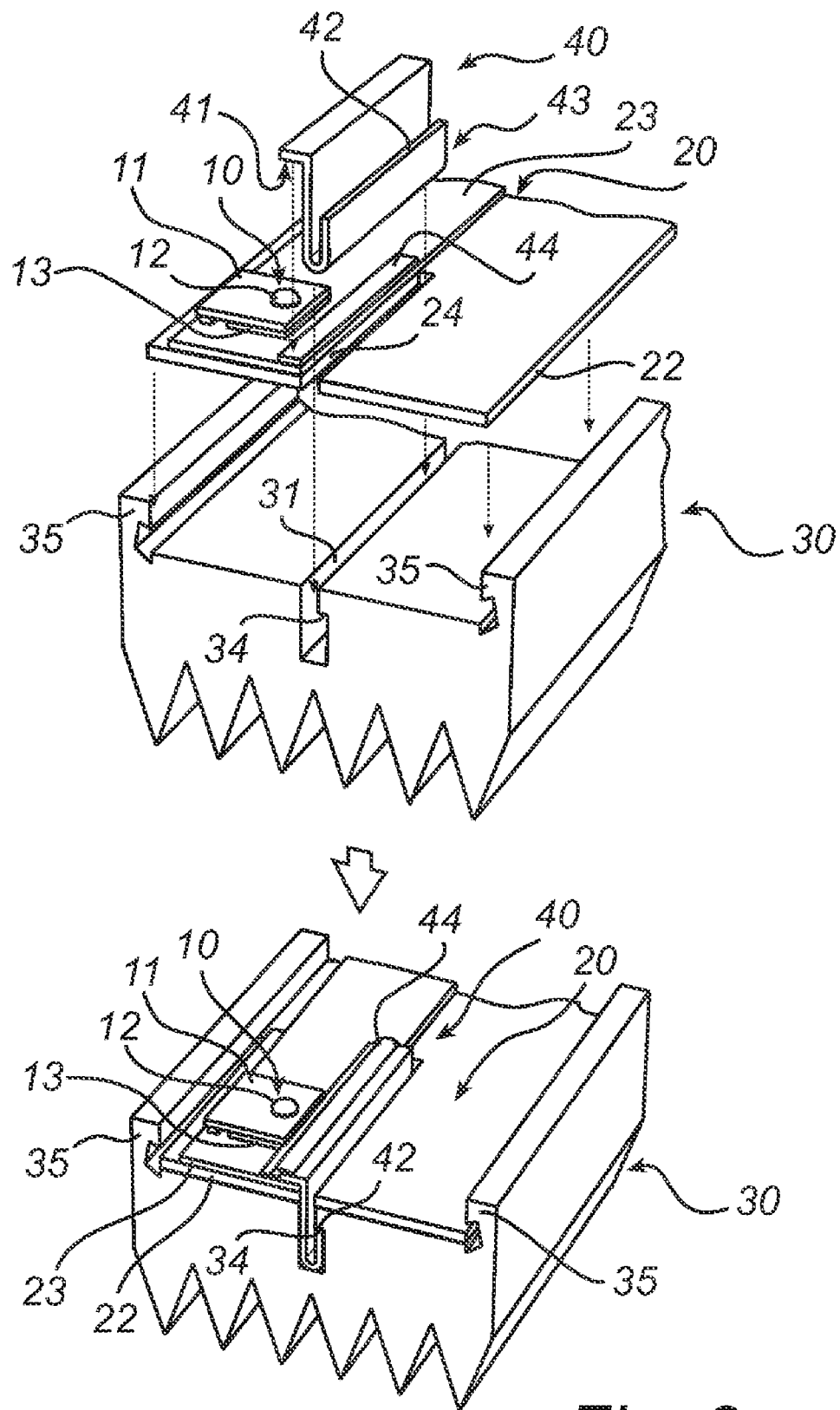
FIG. 2 is a perspective view of an embodiment of the invention.

FIG. 2 illustrates an arrangement where a light emitting diode (LED) 10 is mounted on a printed circuit board (PCB) 20. The PCB 20 is provided with a mounting element 40 which is adapted to engage with a recess 31 in a heat sink 30. This enables the PCB 20 to be mounted to the heat sink 30.

The LED 10 typically comprises an LED body 11 and a lens 12 in transparent resin. The PCB 20 comprises a copper sheet 23 laminated onto a dielectric substrate 22. Typically, there are electrical circuit traces etched from the copper sheet 23 to provide appropriate circuitry, wherein the dielectric substrate 22 provides electrical insulation between the electrical circuit traces and the heat sink 30. The copper sheet 23 also forms a thermally conductive layer arranged on top of the PCB 20 (i.e. facing away from the heat sink). The area of the PCB covered by the thermally conductive layer may vary depending on the application, as long as efficient thermal contact is provided between the LED and the mounting element. Although the thermally conductive layer here is formed by a copper sheet, it could also be of some alternative material having high thermal conductivity. Typical thickness of the thermally conductive layer is 35 or 70 microns.

The LED 10 is attached to the PCB 20 by means of soldering, wherein the PN junction of the LED 10 is electrically connected to the circuit traces of the PCB 20 for powering the LED. Furthermore, a separate solder point 13 provides thermal contact between the PN junction and the part of the copper sheet constituting the thermally conductive layer 23.

The mounting element 40 is here arranged in an opening 24 in the PCB 20. This enables a stable attachment of the PCB to the heat sink 30 using a single mounting element 40, as the mounting element can be located, for example, near the centre of the PCB 20. Utilizing a single mounting element also avoids static over dimensioning thereby reducing stress that may otherwise occur in the PCB 20 when mounted to the heat sink 30.

The mounting element 40 is typically made of copper or some other material having a high thermal conductivity, such as carbon or an aluminium alloy. In this embodiment, the mounting element 40 is provided with an attachment surface 41 essentially parallel to the thermally conductive layer 23, wherein efficient thermal transfer between the thermally conductive layer 23 and the mounting element 40 can be achieved. In order to further promote thermal transfer, the mounting element 40 is attached to the thermally conductive layer 23 by means of soldering illustrated by the solder point 44. The mounting element is typically soldered to the PCB simultaneously with the LEDs. This is typically done before the PCB 20 is arranged on the heat sink 30.

The mounting element 40 has a connecting portion 43, which here extends perpendicularly from the PCB 20. In the embodiment illustrated in FIG. 2, the connecting portion is essentially U-shaped as viewed in cross section. The U-shaped design enables contact with the two opposing sides of the inside of the recess 31, thereby providing a large contact surface between the mounting element 40 and the heat sink 30 and good thermal transfer. The U-shaped design typically allows an inherent flexibility, urging the connecting portion 43 into contact with the inside of the recess 31, and thereby promoting thermal transfer. This also promotes frictional engagement between the connecting portion 43 and the recess 31 and holds the PCB 20 to the heat sink 30 upon attachment.

The heat sink 30 is typically made of metal such as aluminium. It is provided with a recess 31, here in the form of a groove 31, in a surface facing the PCB (also referred to as upper surface of the heat sink). In the embodiment illustrated in FIG. 2, the groove 31 extends along a straight line in the upper surface of the heat sink 30, and has a uniform cross-section throughout its extension. The groove 31 advantageously reaches at least one edge of the heat sink 30, so that an opening is formed in the heat sink through which the connecting portion 43 of the mounting element 40 can be slid in and/or out of the groove 31. The cross section is here essentially rectangular to match the U-shaped connecting portion 43 of mounting element 40. In this embodiment the groove 31 is centered in the heat sink 30.

The thermal transfer between the mounting element 40 and the heat sink 30 can be enhanced by increasing the contact surface therebetween, for example, by providing a mounting element 40 having a longer extension in the direction of the groove 31.

By the above described arrangement, the PCB 20 can be attached to the heat sink 30 by arranging PCB 20 over the heat sink 30 and simply pressing the mounting element 40 into the groove 31.

Due to its U-shaped design, the connecting portion 43 of the mounting element 40 will be somewhat compressed as it is introduced into the groove 31. Thus, the inherent flexibility of the U-shaped connecting portion 43 urges the connecting portion 43 into contact with the heat sink 30, providing good thermal contact and holding the PCB 20 to the heat sink 30 as the connecting portion 43 frictionally engage with the groove 31. The recess 31 may also have an abutment 34 adapted to engage with a corresponding abutment 42 of the connecting portion 43 to secure the engagement, as exemplified by the embodiment illustrated in FIG. 2, thereby providing a "snap fit". The PCB 20 may be removed from the heat sink by moving the PCB parallel to the groove, thereby sliding the connecting portion 43 out of the groove 31.

The heat sink 30 can also be provided with protrusions 35 along the edges to avoid that the PCB lifts itself excessively from the heat sink 30. These protrusions are typically arranged on the sides of the heat sink 30 which are parallel to the groove 31.

In operation heat generated at the PN junction of the LED 10 is conducted via the solder point, to the thermally conductive layer 23, and further transferred via the mounting element 40 to the heat sink 30 and to the ambient environment. Typical LED temperatures are here about 130° C., and the heat sink typically can have a temperature up to 80° C.

Figure 3:
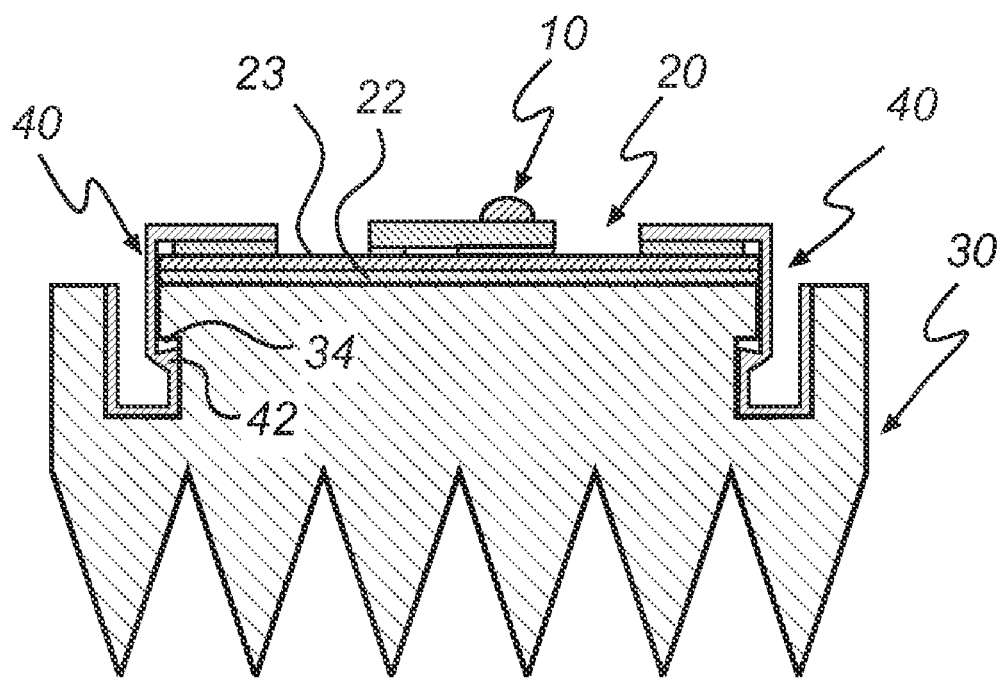
FIG. 3 is a cross sectional view of an alternative embodiment of the invention.

According to another embodiment multiple mounting devices 40 may be used to attach the PCB 20 to the heat sink 30. An example of such an embodiment is illustrated in FIG. 3. Here, the PCB 20 is attached to the heat sink 30 by two mounting elements 40 arranged on either side of the PCB 20. This embodiment also illustrates an example of an alternative design of the abutments 34, 42 of the mounting element and the recess.

According to yet another embodiment, the groove may also be provided with a neck, or be tapered towards the upper surface of the heat sink. Thus, as the connecting portion is introduced therein the U-shaped connecting portion will be compressed wherein a spring force urges the mounting element into contact with the heat sink, and frictionally engage with the groove.

The invention has mainly been described above with reference to a few embodiments. However, as is readily appreciated by a person skilled in the art, other embodiments than the ones disclosed above are equally possible within the scope of the invention, as defined by the appended claims.

Figure 4:
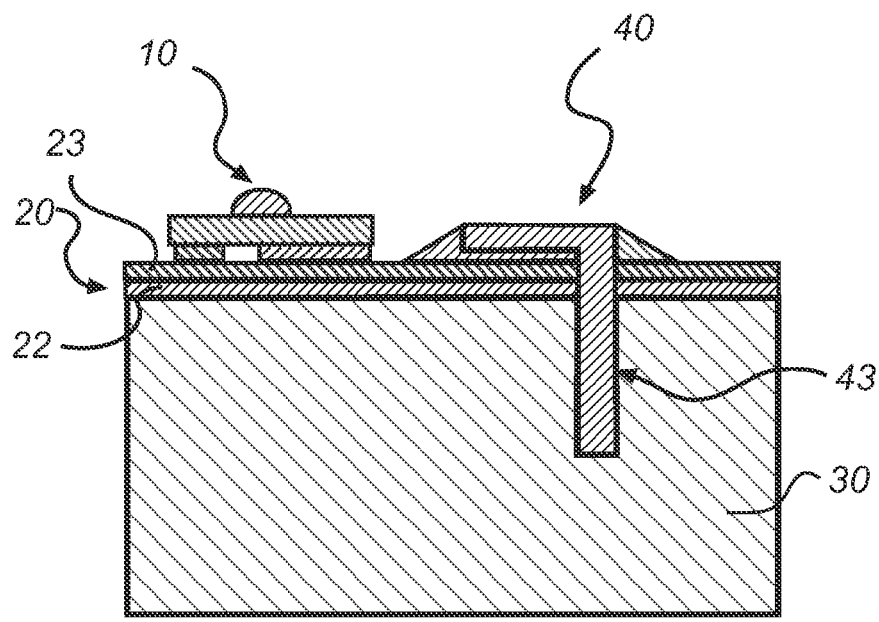
FIG. 4 is a cross sectional view of an alternative embodiment of the invention.
Figure 5:
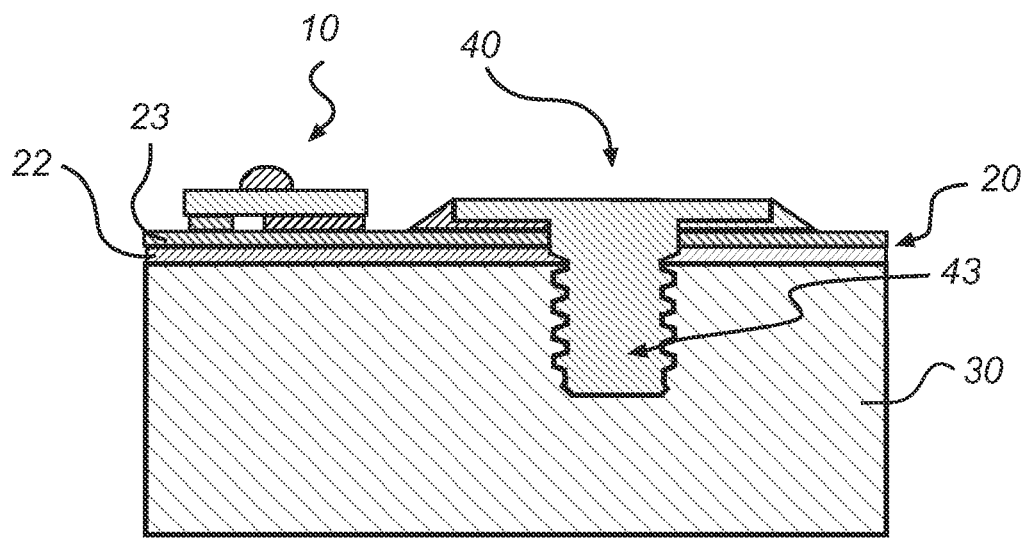
FIG. 5 is a cross sectional view of an alternative embodiment of the invention.

For instance, although the mounting element here has been described with a U-shaped connecting portion it may have a variety of shapes. For example, the connecting portion could have an anchor-shaped cross-section or a hollow rectangular cross-section. The connecting portion may also be solid as exemplified in FIGS. 4 and 5. FIG. 5, also illustrates how the contact surface between the mounting element and the recess can be enlarged by providing longitudinal ridges extending in the direction of the groove. This enables enhanced heat transfer, and may be advantageous, for example, when a large number of LEDs are mounted on a limited surface. The longitudinal ridges may also secure the connecting portion 43 of the mounting element 40 to the groove.

Although the above described embodiments have been described with a single heat generating electrical component, it is recognized that the invention is equally applicable for a plurality of heat generating electrical components arranged on a PCB.

Furthermore, the invention is not limited to cooling of LEDs, but could equally well be used for heat dissipation of other heat generating electrical components, such as, for example MOS-FETs.

The invention claimed is:

1. An arrangement for heat dissipation for a heat generating electrical component, the arrangement comprising:
    a heat sink having at least one recess;
    a printed circuit board, a bottom of said printed circuit board arrangeable on top of said heat sink, said printed circuit board comprising a dielectric substrate on top of the printed circuit board and a thermally conductive layer disposed on a top side of the dielectric substrate facing away from said heat sink;
    the heat generating electrical component arranged on said printed circuit board, said heat generating electrical component being disposed on the top side of said dielectric substrate facing away from said heat sink and in thermal contact with said thermally conductive layer; and
    a thermally conductive mounting element attached to said thermally conductive layer by means of soldering, wherein said mounting element comprises a connecting portion adapted to engage with said recess in said heat sink, thereby enabling attachment of said printed circuit board to said heat sink, so that a thermal path is provided from said heat generating electrical component, via said thermally conductive layer and said mounting element, to said heat sink, wherein said thermal path from said heat generating electrical component, via said thermally conductive layer and said mounting element, to said heat sink is the primary means by which heat is dissipated from said heat generating electrical component to said heat sink.

2. An arrangement according to claim 1, wherein said heat generating electrical component is an LED.

3. An arrangement according to claim 1, wherein said recess is a groove debouching at a periphery of said heat sink, wherein an opening is formed in said heat sink for enabling said mounting element to be slid in and/or out of said groove.

4. An arrangement according to claim 1, wherein said connecting portion is adapted to be brought into contact with two opposing sides of an inside of said recess.

5. An arrangement according to claim 1, wherein said connecting portion is adapted to be compressed upon engagement with the recess, and to be held in place by spring action.

6. An arrangement according to claim 1, wherein said recess has an abutment adapted to engage with a corresponding abutment of said connecting portion.

7. An arrangement according to claim 1, wherein said printed circuit board is provided with an opening, wherein said mounting element extends through said opening.

8. An arrangement according to claim 1, wherein said mounting element is made of copper.

9. A method of electrical component assembly comprising the steps of:
    mounting a heat generating electrical component to a thermally conductive layer that is on a top side of a printed circuit board by means of soldering;
    attaching a thermally conductive mounting element to said thermally conductive layer by means of soldering;
    providing a heat sink having at least one recess; and
    attaching a bottom of said printed circuit board to a top side of said heat sink by engaging a connecting portion of said mounting element with the at least one recess in said heat sink;
    wherein said thermally conductive layer of said printed circuit board faces away from said heat sink, and wherein a thermal path is provided from said heat generating electrical component, via said thermally conductive layer and said mounting element, to said heat sink and wherein said thermal path from said heat generating electrical component, via said thermally conductive layer and said mounting element, to said heat sink is the primary means by which heat is dissipated from said heat generating electrical component to said heat sink.

* * * * *